United States Patent [19]

Holcomb, Sr. et al.

[11] Patent Number: 4,977,613
[45] Date of Patent: Dec. 11, 1990

[54] FINE TUNING FREQUENCY SYNTHESIZER WITH FEEDBACK LOOP FOR FREQUENCY CONTROL SYSTEMS

[75] Inventors: Don R. Holcomb, Sr., Scottsdale; Mark J. Brown, Phoenix; Lawrence R. Schumacher, Mesa, all of Ariz.

[73] Assignee: Motorola, Inc., Schaumburg, Ill.

[21] Appl. No.: 258,747

[22] Filed: Oct. 17, 1988

[51] Int. Cl.[5] ............................................. H04B 1/26
[52] U.S. Cl. ................................... 455/182; 455/192; 455/260; 455/296; 331/1 A
[58] Field of Search ............... 455/207, 208, 209, 164, 455/182, 192, 165, 183, 258, 259, 260, 264, 296, 183; 331/1 A, 31

[56] References Cited

U.S. PATENT DOCUMENTS

| | | |
|---|---|---|
| 4,038,689 | 7/1977 | Rzeszewski ........................ 455/183 |
| 4,491,976 | 1/1985 | Saitoh ................................ 455/315 |
| 4,521,916 | 6/1985 | Wine .................................. 455/182 |
| 4,551,856 | 11/1985 | Victor et al. ...................... 455/183 |
| 4,625,331 | 11/1986 | Richardson et al. ............... 455/164 |
| 4,703,520 | 10/1987 | Rozanski, Jr. ..................... 455/183 |
| 4,709,406 | 11/1987 | Omoto ............................... 455/183 |

Primary Examiner—Reinhard J. Eisenzopf
Assistant Examiner—Lisa Charouel
Attorney, Agent, or Firm—Maurice J. Jones

[57] ABSTRACT

An additional mixer is included in the feedback loop of a PLL which can be one of the local oscillators of a dual conversion system. A fine tuning frequency synthesizer is coupled to an input of the additional mixer for providing fine frequency control of the PLL. The fine tuning frequency synthesizer can include an additional phase locked loop. Also, a feedback signal for suppressing noise created by another local oscillator can also be applied to the additional mixer.

13 Claims, 2 Drawing Sheets

FINE TUNING FREQUENCY SYNTHESIZER WITH FEEDBACK LOOP FOR FREQUENCY CONTROL SYSTEMS

BACKGROUND OF THE INVENTION

This invention relates in general to the tuning of frequency conversion and/or synthesizer systems and more particularly to the fine tuning of such circuitry including phase locked loops (PLLs).

Modern high frequency communication systems such as transceivers or equipments for testing such systems often include frequency converter or synthesizer circuits which can perform a variety of functions. For instance, such circuitry is sometimes utilized in transceivers or test equipment to provide a selected local oscillator signal when such equipment is operated in a "receive mode" or to provide an output signal having a selected stable reference frequency for converting the frequencies of a modulated signal when such equipment is operated in a "transmit mode" or as a signal generator.

More specifically, such transceiver or test equipment systems commonly have a prior art PLL which includes a phase detector having an output coupled through a loop filter to control the frequency of a Voltage Controlled Oscillator (VCO). The output of the VCO is fed back through a divide-by-M circuit to a first input of the phase detector. A constant reference frequency signal is applied to a second input of the phase detector by a crystal oscillator, for instance. The frequency of the VCO output signal is changed in steps by changing "M" of the divide-by-M circuit in a known manner. This prior art circuitry is capable of providing M discrete frequencies which are each separated from the nearest discrete frequency by the frequency of the reference oscillator.

It is desirable for the reference frequency to have a relatively high magnitude so that the magnitude of "M" can be kept to a minimum for a given frequency band. As a result, the PLL is thereby enabled to have a relatively wide bandwidth which, inter alia, facilitates rapid changing of frequency when "M" is changed and effective elimination of noise created by the various active components in the loop.

Prior art transceiver and/or test equipment sometimes also include a "dual conversion" system having a first tunable local oscillator and first mixer for translating frequency components of a received signal either up or down so that they fall within the bandpass of a first Intermediate Frequency (IF) amplifier. The first local oscillator can include the above-described divide-by-M PLL. A second fixed local oscillator and second mixer may be utilized in a known manner to further convert the frequencies of the first IF signal to provide a second IF signal. As will subsequently be described in more detail, it is known to feedback a portion of this second fixed local oscillator signal to another mixer included in the feedback loop for the PLL of the first local oscillator which results in a desirable cancellation at the second mixer of noise created by the second local oscillator.

As described above, changing the value of "M" in the PLL provides a broad tuning control of the frequency thereof. In many applications it is also desirable to provide circuitry for enabling "fine tuning" of the frequency of the PLL output signal to cover the frequency band between each of the various discrete output frequencies of the PLL provided by tuning "M". The required fine tuning can be either continuous or in predetermined incremental steps. Having high reference frequencies complicates this "fine tuning" requirement.

One prior art double conversion system having fine tuning employs a third mixer and a third local oscillator which is tunable over a relatively small range. The third local oscillator provides adjustment in the center frequency of the signal to be processed after the signal passes through the second IF stage. Unfortunately, the addition of this third mixer and third local oscillator tends to increase the noise level of the signal and the extra components provide increased cost and increased complexity which result in decreased reliability of systems in which it is employed. Shifts in the third local oscillator frequency also produce an undesirable shift in first I.F. frequency. Other prior art techniques for providing the fine tuning function of PLLs provide still other disadvantages.

Furthermore, some prior art systems require circuitry redundant to that used for the "receive" mode to provide frequency conversion when the transceiver or test equipment is operated in the "transmit" or output signal generator mode.

SUMMARY OF THE INVENTION

Accordingly, it is an object of the present invention to provide improved PLL control circuitry for creating a plurality of discrete frequencies each of which can be fine tuned.

The above and other objects and advantages of the present invention are carried out in one form by providing an additional mixer having an input and an output coupled in the feedback loop of the PLL between the output of the VCO and one of the input terminals of the phase detector. Tunable fine tuning circuitry is connected to another input terminal of the additional mixer to adjust the frequency of the feedback signal to thereby selectively change the frequency of the PLL.

If the fine tuning circuitry is utilized with the above described dual conversion signal processing circuitry having noise cancellation, then the fine tuning circuitry can be coupled between the output of the second fixed local oscillator and the mixer included in the feedback loop for the first tunable local oscillator PLL. The fine tuning circuitry can be implemented by either the combination of a fine frequency synthesizer and a further mixer or by a further PLL, for instance.

BRIEF DESCRIPTION OF THE DRAWINGS

A more complete understanding of the present invention may be derived by reference to the detailed description and claims which considered along with the accompanying drawings, in which like reference numbers indicate similar parts and wherein:

DETAILED DESCRIPTION OF THE PREFERRED EMBODIMENT

Figure 1:
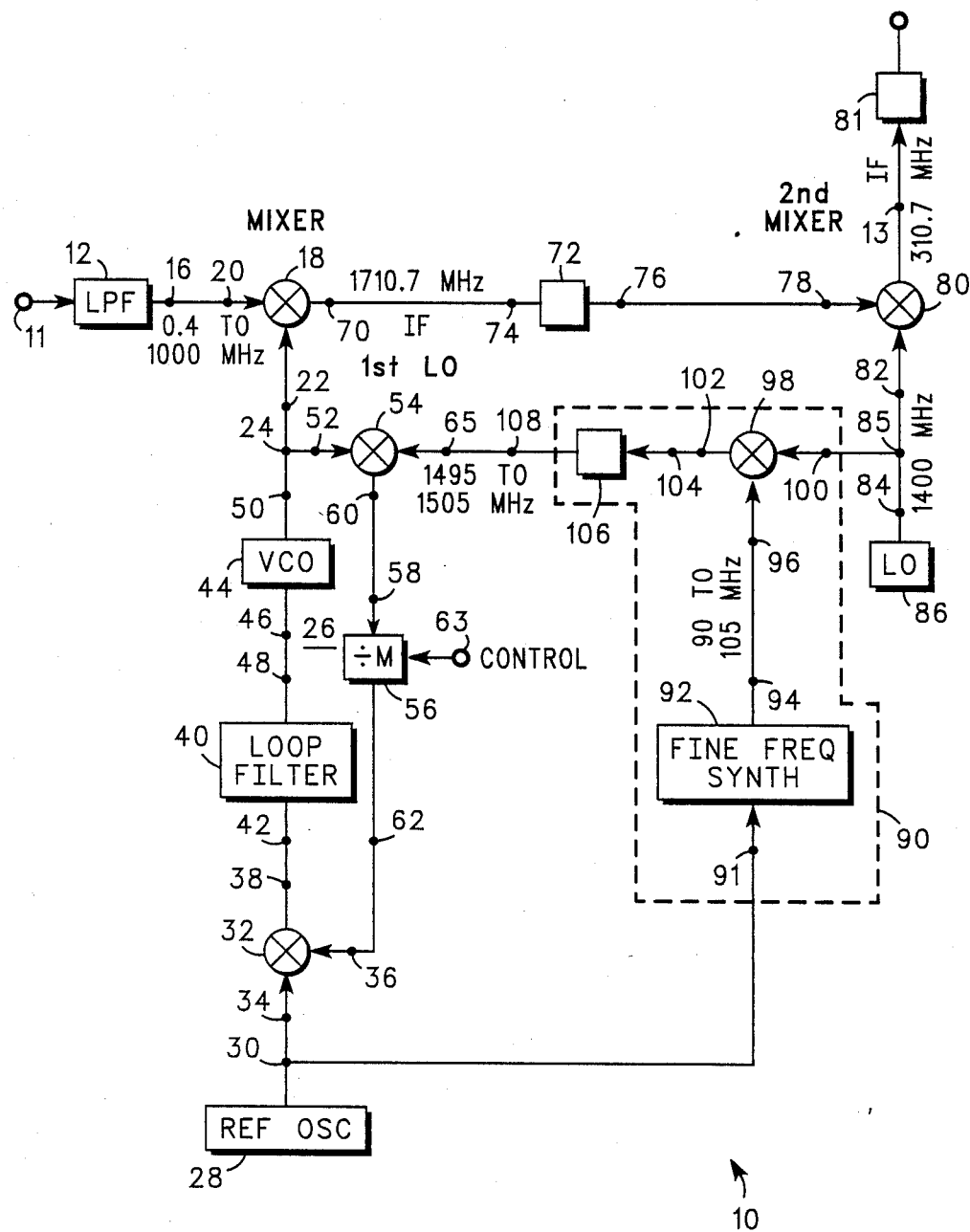
FIG. 1 is a block diagram of the one embodiment of frequency control circuitry in accordance with the present invention including fine tuning circuitry of one form.

Referring now to the drawings, FIG. 1 illustrates a frequency control system 10 which can be employed in frequency conversion and/or synthesizer applications involving high frequency receivers, transmitters, transceivers, or test equipment, for instance. System 10 is operable in a receive or "first mode" wherein input signals applied to terminal 11 are frequency converted into output signals applied to output terminal 13. Alternatively, system 10 is also operable in a transmit or "second mode" wherein input signals applied to terminal 13 are frequency converted into output signals applied to terminal 11.

In the aforementioned first mode of operation, input signals within a wide bandwidth of, for instance, between 0.4 MHz and 1000 MHz are applied to input terminal 11 by an antenna or other signal source. System 10 includes a low pass filter 12 connected between terminal 11 and terminal 16. Mixer 18, which provides a first Intermediate Frequency (IF) signal, includes a first input terminal 20 connected to output terminal 16 of low pass filter 12. A second input terminal 22 of mixer 18 is connected to output terminal 24 of PLL 26 which operates as a first local oscillator when system 10 functions as a frequency converter in the first mode of operation.

PLL 26 includes a reference oscillator 28, which may be a crystal oscillator, that provides a stable reference frequency at output terminal 30 thereof. Phase/frequency detector 32 includes a first input terminal 34, a second input terminal 36 and an output terminal 38. Output terminal 30 of oscillator 28 is coupled to input terminal 34 of detector 32. Loop filter 40 includes an input terminal 42 which is connected to output terminal 38 of phase detector 32. Voltage Controlled Oscillator (VCO) 44 has a control terminal 46 which is connected to output terminal 48 of loop filter 40. VCO 44 further has an output terminal 50 which is connected to output terminal 24 of PLL 26 and to input terminal 52 of loop mixer 54. Divide-by-M circuit 56 includes an input terminal 58 which is connected to output terminal 60 of mixer 54. Moreover, output terminal 62 of divide-by-M circuit 56 is connected to input terminal 36 of phase detector 32.

Assuming that no other signals are applied to the feedback loop through mixer 54, the frequency of the output signal of VCO 44 and thus of PLL 26 is equal to M multiplied by the reference frequency of oscillator 28. Hence, the output frequency is changed by changing "M" of the divide-by-M circuit by applying control signals to control terminal 63 thereof. By incrementing M, the output frequency at terminal 22 is moved in steps spaced apart by at least the reference frequency. M can be changed over an arbitrary range, for instance, divide-by-M circuit 56 can be designed such that M is continuously changeable from 21 to 121, for example.

For optimum system performance, it is desirable for reference oscillator 28 to operate at a high frequency. One reason this for this is that relatively higher reference frequencies require smaller values of M to obtain a particular output frequency at terminal 24. M can be thought of as a multiplier of loop noise so it is desirable for M to have as low a magnitude as possible so that the noise does not get multiplied anymore than necessary. Furthermore, the maximum loop bandwidth is a predetermined fraction of the reference frequency. Thus, if the reference frequency is higher, then the maximum loop bandwidth can be higher. The greater the loop bandwidth, the greater the loop gain at a given frequency near the upper limit of the bandwidth because of the decreased attenuation provided by higher gain loops as frequency increases. High gain is also desirable to enable PLL 26 loop to compensate for frequency jitter in VCO 44 or other forms of noise within the loop. Additionally, higher gain enables PLL 26 to lock more quickly at the desired frequency when M is changed. Thus, there are many advantages from oscillator 28 providing a reference frequency of a relatively high magnitude.

However, as loop bandwidth is increased, the effects of noise created by reference oscillator 28 and of the flat noise of the loop itself tends to increase. Hence, for optimum conditions, the loop bandwidth is generally increased until the level of the flat noise is made approximately equal to the level of the noise created by VCO 44.

A disadvantage of having a reference frequency of a high magnitude is that the output frequency steps, which are separated by no less than the magnitude of the reference frequency, are spaced too far apart for many applications. Generally, a change in M is utilized to provide a coarse frequency adjustment of the output signal frequency of PLL 26. Thus, it is essential in many applications to provide other circuitry for fine tuning the output signal frequency of PLL 26 to cover the frequencies between the discrete frequencies provided by changing "M". The structure and function of the fine tuning provided by system 10 will subsequently be described.

When operated in the aforementioned first mode it is desirable, for example, that mixer 18 subtract the frequencies of the band of input signals applied to terminal 20 thereof from the frequency of the output signal of PLL 26 to provide an output signal at output terminal 70 of approximately 1710.7 MHz which is the center frequency of IF amplifier 72. Thus, if the frequency of the input signal is between 0.4 and 1000 MHz, it is desirable for PLL 26 to provide single frequency output signals having predetermined frequencies within the range between 1711.1 to 2710.7 MHz.

Hence, the frequency of the input signal is actually up converted in frequency by mixer 18. As is well-known in the art, up conversion is utilized to enable low pass filter 12 to attenuate spurious input signals which otherwise could cause undesirable responses at the output of mixer 18. For instance, undesirable input signals at terminal 16 at the "image" frequency which equals the output frequency of PLL 26 plus the IF of 72 is a spurious signal capable of otherwise causing undesirable responses within the bandpass of the IF 72. By enabling the IF of 72 to be high as a result of the up conversion of mixer 18, these undesirable spurious input signals have to have high frequencies. However, such high frequency spurious signals are eliminated or substantially attentuated by low pass filter 12. Hence, up conversion enables the use of a single tunable local oscillator in the form of PLL 26 and a single low pass filter 12 to cover a wide input band. Otherwise, a complex and expensive preselector might have to be used in the signal path in the place of filter 12.

IF bandpass amplifier and filter stage 72 includes an input terminal 74 connected to output terminal 70 of mixer 18. Output terminal 76 of IF stage 72 is connected to an input terminal 78 of another IF mixer 80. The bandpass of IF amplifier 72 can be around 30 MHz with a center frequency of 1710.7 MHz to allow frequency converted input signal energy to pass therethrough. This energy can be swept by subsequent spectrum analyzer (not shown) that may swing plus or minus 10

MHz, for instance, so that the precise frequency components of the signals being received can be determined.

IF mixer 80 further includes a second input terminal 82 which is connected to output terminal 84 of local oscillator 86 which provides a single fixed frequency of 1400 MHz. Terminal 13 of mixer 80 can be switchably connected to a further IF amplifier and filter 81 having a bandwidth of 30 MHz and a center frequency of 310.7 MHz, for instance. Local oscillator 86 and IF mixer 80 reduce or down convert the frequencies of the first IF signal provided by amplifier 72 to the lower frequency range centered around 310.7 MHz, for instance. This down conversion enables inexpensive filters, amplifying stages, and other signal processing circuitry to be coupled to output terminal 13 of IF mixer 80.

Unfortunately, the 1400 MHz output frequency of the output signal provided by local oscillator 86 may tend to shift or jitter for many reasons. This undesirable frequency perturbation is referred to as a "noise" signal. Since the noise signal is applied to terminal 82 of mixer 80, such noise tends to undesirably effect the frequency of the IF signal product at terminal 13. To eliminate or reduce the effects of such noise, the output signal of local oscillator 86 can be applied to input terminal 65 of noise reduction mixer 54 which results in superimposition of the noise signal on the frequency control signal for VCO 44. This operation causes the output frequency of the output signal at terminal 22 of PLL 26 to change with the "noise". The changing output signal is applied to the IF signal up mixer 18, through amplifier 72 and to terminal 78 of IF signal down mixer 80. Thus, the difference in magnitude of frequencies applied to input terminals 78 and 82 of difference mixer 80 remains unchanged by the noise. As a result, mixer 80 cancels out undesirable changes otherwise caused by the noise component of the output signal of second local oscillator 86 by subtracting the signals applied to input terminals 78 and 82 thereof.

For example, assume local oscillator 86 tends to cause an undesirable downward shift or noise in the frequency of the output signal at terminal 82 of 10 Hz. As a result, a corresponding downward shift of 10 Hz in the control signal at output terminal 60 of loop mixer 54 results. Accordingly, VCO 44 would be controlled through phase detector 32 and loop filter 40 to reduce the frequency of the signal at output terminal 22 thereof by 10 Hz. This causes the output signals of IF mixer 18 and of IF amplifier 72 to likewise be reduced by 10 Hz. Thus, the otherwise undesirable downward shift in frequency of 10 Hz at input terminal 82 of mixer 80 would be compensated by the corresponding downward shift of 10 Hz at input terminal 78. Accordingly, the output frequency at terminal 13 of mixer 80 remains constant even though the frequency of the local oscillator 86 has shifted. Moreover, PLL 26 tends to compensate for undesirable shifts in frequency of VCO 44 because a divided version thereof is compared against the reference frequency by phase/frequency detector 32. Hence, frequency control circuitry 10 tends to facilitate low noise operation.

As previously mentioned, it is desirable to use a reference frequency provided by oscillator 28 of PLL 2 having a relatively high magnitude to enhance system performance. The disadvantage, however, of using a high reference frequency is that incrementation of the value of M causes PLL 26 to provide different discrete output frequencies at different times which are spaced by some multiple of the reference frequency having a high magnitude. Thus, these frequencies tend to be spaced far apart.

In many applications, it is necessary to shift the frequency of the output signal of PLL 26 at terminal 24 so as to provide a "fine" tuning function. For instance, it is useful to shift the output frequency at terminal 24 up and down by more than the magnitude of the reference frequency so that a predetermined frequency range can be completely covered. To accomplish this result, the fine tuning circuitry enclosed within dashed block 90 has been included. This fine tuning circuitry can utilize noise suppression mixer 54 to reduce costs and further includes a fine tuning mixer 98 and a fine frequency synthesizer 92 which provides an output signal at terminal 94 thereof having a frequency which is variable between 95 MHz and 105 MHz, for example. The frequency of the output signal of fine frequency synthesizer 92 can be continuously adjustable or it can be adjustable in predetermined incremental steps. Output terminal 94 of fine frequency synthesizer 92 is connected to input terminal 96 of fine tuning mixer 98 which has another input terminal 100 connected to output terminal 84 of local oscillator 86. Output terminal 102 of mixer 98 is connected to input terminal 104 of bandpass filter 106 which has an output terminal 108 connected to input terminal 65 of loop mixer 54. Fine tuning mixer 98 produces an output signal including the sum and difference of the signals applied to its input terminals 96 and 100 along with other output frequency components. Bandpass filter 106, which can be included in mixer 98, is designed to pass either the sum or the difference of these frequencies depending upon the application.

The output signal of bandpass filter 106 is mixed with the sampled VCO output frequency occurring at input terminal 52 of mixer 54 to provide an output signal at output terminal 60 which is subsequently divided by M and compared with the output signal from local oscillator 28 to provide a dynamic control signal at output terminal 38 of phase detector 32. Loop filter 40 filters the control signal and applies it to control terminal 46 of VCO 44. Assuming the output of local oscillator 86 is noise free, the output frequency of PLL 26 equals M times the reference frequency of oscillator 28 plus the frequency of fine frequency synthesizer 92. Thus, changes in the output frequency of fine frequency synthesizer 92 create a corresponding shift or fine tuning frequency in the output frequency of PLL 26 which is applied to terminal 22 of first mixer 18. As a result, increase or decrease in frequency of fine frequency synthesizer 92 results in a tuning action of the signal at terminal 22 of the first IF mixer 18 which fine tunes the output signal selected from low pass filter 12 and shifted into the fixed band of IF amplifier 72. If the range of fine tuning synthesizer 92 equals at least twice the frequency of reference oscillator 28, undesired responses from mixer 54 can be avoided and a frequency band can be continuously covered by changing M and tuning synthesizer 92.

More specifically, it is assumed that second local oscillator 86 is operating at 1400 MHz and that the output of fine frequency synthesizer 92 is at 100.7 MHz. Accordingly, mixer 98 and filter 106 will provide the sum of these frequencies which is 1500.7 MHz at output terminal 108. Assuming VCO 44 is running at 1910.7 MHz, the difference mixer 54 will provide a signal to output terminal 60 thereof having a frequency of 410 MHz. Assuming that a divide-by-8 prescaler (not shown) is included in series with divide-by-M circuit 56 and assuming that divide-by-M 56 is set to 41, then the output signal at terminal 62 of the divide-by-M circuit will be 1.25 MHz. Phase detector 32 will compare this 1.25 MHz signal with the reference frequency which is also assumed to be 1.25 MHz to lock the VCO at 1910.7 MHz. IF amplifier 72 will select the 1710.7 MHz frequency components from mixer 18 caused by input frequencies at terminal 20 of 200 MHz which is the difference between the output frequency of PLL 26 (1910.7 MHz) and the frequency of the signals applied to terminal 20 (200 MHz).

If the frequency of the output of fine frequency synthesizer 94 is then adjusted by a particular amount, a different frequency will be applied to input terminal 65 of loop mixer 54 which after being prescaled and divided will cause a different frequency to occur at terminal 36 of phase detector 32. As a result, phase detector 32 will provide a modified signal at output terminal 38 thereof which after being filtered will force VCO 44 to operate at a new frequency adjusted by the particular amount.

The circuitry enclosed in dashed line 90 of FIG. 1 can also be implemented in other forms. It is necessary that the circuitry included in block 90 preserve any frequency shifts of second local oscillator 86 so that these frequency shifts will ultimately be cancelled by mixer 80 as previously explained. An example of an alternative embodiment 120 of circuitry 90 is shown in FIG. 2 wherein the same reference numbers as used in FIG. 1 are used to designate like structure.

Fine frequency tuning circuitry 120 includes an adjustable reference oscillator 122 which provides either a continuously variable or incrementally steppable frequency of the output signal at output terminal 124 thereof. Phase/frequency detector 126 includes input terminals 128 and 130 and an output terminal 132. Loop filter 134 includes an input terminal 136 which is connected to output terminal 132 of phase detector 126. VCO 138 includes a control terminal 140 which is connected to output terminal 142 of loop filter 134. Output terminal 144 of VCO 138 is connected to input terminal 65 of loop mixer 54 and to input terminal 146 of fine tuning mixer 148. Input terminal 150 of mixer 148 is connected to node 85 which is connected to output terminal 84 of fixed local oscillator 86. Output terminal 152 of fine tuning mixer 148 is connected to input terminal 130 of detector 126.

In operation, the settable reference frequency provided by reference oscillator 122 is mixed with the feedback signal by detector 126 to provide a control signal that is filtered by loop filter 134 to provide a control signal for VCO 138. Mixer 148 assures that noise generated by fixed local oscillator 86, for instance, is ultimately applied to noise suppression mixer 54 so that it can be cancelled in the aforementioned manner.

Figure 2:
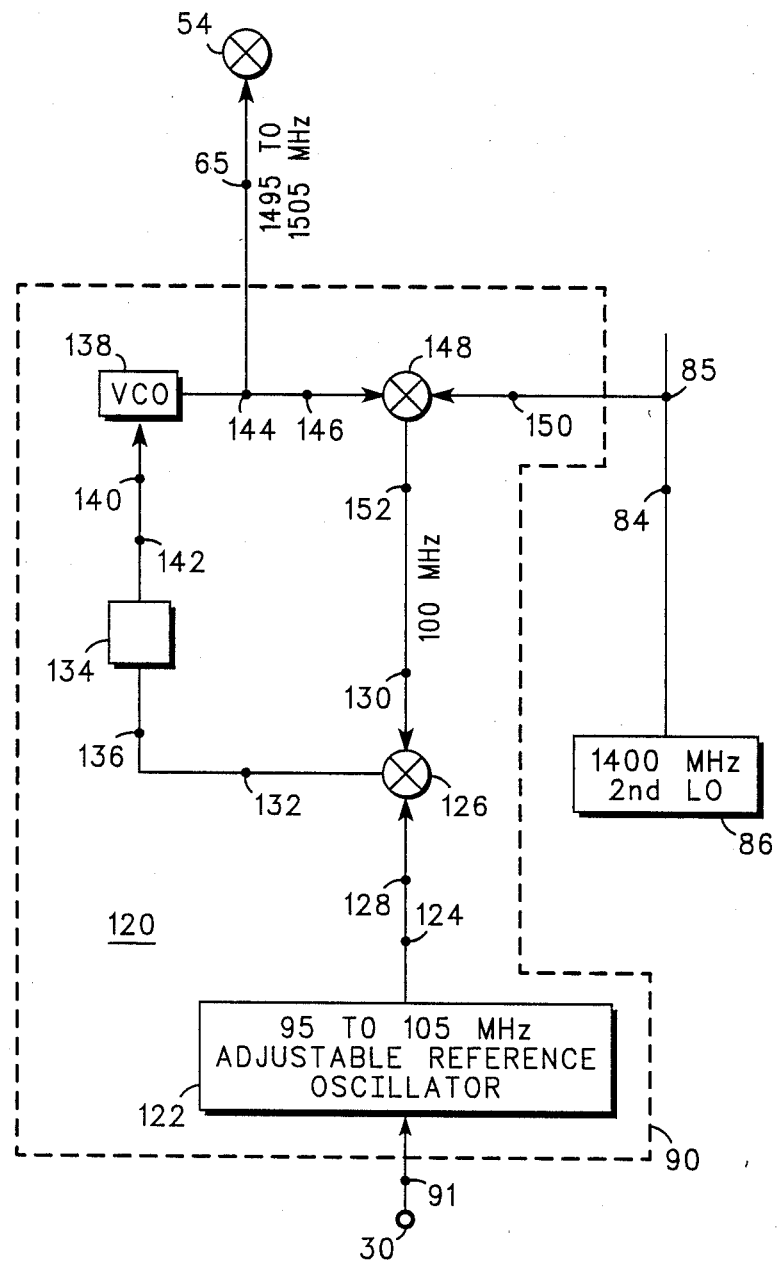
FIG. 2 is a block diagram of another implementation of the fine tuning circuitry.

As shown in FIGS. 1 and 2, output terminal 30 of reference oscillator 28 is connected to control terminals 91 of blocks 90 so that the output signal of reference oscillator 28 can also drive or synchronize fine frequency synthesizer 92 and or adjustable reference oscillator 122. This accomplishes reduction or cancellation by mixer 54 of noise generated by reference oscillator 28. More specifically, such noise components created by oscillator 28 are coupled to input terminal 52 of mixer 54 through the series circuit including detector 32, loop filter 40, and VCO 44. Also, the noise components of oscillator 28 are coupled to input terminal 65 of mixer 54 through the circuitry of block 90. Mixer 54 subtracts the noise components occurring at its inputs so that they are reduced or eliminated from the feedback control signal at output terminal 60 of mixer 54. This operation tends to reduce the noise created by oscillator 28 which would other occur at PLL output terminal 22. Thus, frequency control system 10 of FIG. 1 operates as a frequency synthesizer circuit for creating an output signal having anyone of a plurality of discrete frequencies in response to changes in the value of M of divide-by-M circuit 56. Each of these frequencies can be fine tuned to cover at least the frequency ranges between each discrete frequency by utilizing the fine tuning frequency structure included in dashed block 90 of FIG. 1 or of FIG. 2. The fine tuning function provided by the circuitry in block 90 allows PLL 26 to operate with a high reference frequency because fine tuning circuitry 90 can provide substantial changes in the output frequency of PLL 26 to thereby cover a band which is at least twice the frequency of the reference oscillator 28, for instance. Fine tuning circuitry 90 can adjust the output frequency of PLL 26 continuously over a continuous range of frequency or in predetermined incremental steps so that either particular known channels or unknown channels can be identified. Fine tuning circuitry 90 is particularly applicable for use in fine tuning PLLs used in dual conversion signal processing circuitry having noise suppression such as that shown in FIG. 1. However, other applications are also contemplated.

The frequency control circuitry 10 shown in FIG. 1 is responsive to an input signal applied to terminal 11 to provide a frequency converted output signal at terminal 13. Also, circuitry 10 is responsive to a frequency modulated input signal, for instance, applied to terminal 13 and converted to an output signal to be applied to terminal 11. The individual circuits of the blocks shown in FIGS. 1 and 2 can be provided by presently available integrated circuitry and/or discrete circuits.

While the invention has been described in conjunction with a specific embodiment thereof, it is evident that many alterations, modifications and variations will be apparent to those skilled in the art in light of the foregoing description. Accordingly, the invention is intended to embrace all such alterations, modifications and variations in the appended claims.

We claim:

1. A frequency converter having an input signal supply for providing input signals coupled to one input of a converter mixer and a phase locked loop coupled to another input of the converter mixer, the phase locked loop being turnable within a continuous frequency band to any one of a plurality of operator selected frequencies to enable the converter mixer to convert the converter signal to an output signal at a selected fixed frequency, the phase locked loop including in combination:

reference frequency oscillator;
    a voltage controlled oscillator having a control terminal;
    a detector with a first input, a second input and an output, said first input of said detector being coupled to said reference frequency oscillator, said output of said detector being coupled to said control terminal of said voltage controlled oscillator;
    a feedback control loop coupling a portion of the output of said voltage controlled oscillator to said second input of said detector;

further mixer means included in said feedback control loop; and fine tuning frequency synthesizer means having an output coupled to said mixer means, said fine tuning frequency synthesizer means being adjustable by the operator to provide a fine tuning control signal to said mixer means to tune the frequency of the phase locked loop, said fine tuning control signal having a selected one of a plurality of predetermined frequencies which are changeable by the operator, said mixer means being responsive to the frequency of said fine tuning control signal to change the output frequency of the phase locked loop in response to adjustment of the frequency of said fine tuning control signal to tune the phase locked loop to any one of the plurality of operator selected frequencies to enable the converter mixer to provide the output signal at the desired fixed frequency.

2. The frequency converter circuit of claim 1 wherein the reference frequency oscillator tends to create noise components which tend to undesirably effect the output of the phase locked loop and wherein said mixer means has a first input terminal, a second input terminal and an output terminal, further including:

first means coupling the noise components of the output signal of the reference frequency oscillator to said fine tuning frequency synthesizer means, said fine tuning frequency synthesizer means being responsive to the noise components to provide a noise control signal to said first input terminal of said mixer means;

second means coupling the noise components to the second input terminal of said mixer means; and said mixer means being responsive to said noise control signal and the noise components to reduce the magnitude of at least some of the noise components from the output signal thereof to reduce their effect on the output of the phase locked loop.

3. The frequency converter circuit of claim 1 wherein the feedback control loop further includes a divide-by-M circuit means having an input terminal and an output terminal, said input terminal of said divide-by-M circuit being coupled to said mixer means and said output terminal of said divide-by-M means being coupled to the second input of the detector, said divide-by-M circuit means providing further broad tuning control signal to the detector for changing the frequency of the phase locked loop circuit.

4. The frequency converter circuit of claim 1 wherein said fine tuning frequency synthesizer means includes a further phase locked loop.

5. In a phase locked loop circuit having a reference frequency oscillator which tends to create noise components that tend to undesirably effect the output signal of the phase locked loop, a voltage controlled oscillator having a control input, a detector with a first input coupled to the reference frequency oscillator and an output coupled to the control input of the voltage controlled oscillator, and a feedback control loop coupling a portion of the output of the voltage controlled oscillator to a second input of the detector, wherein the improvement comprises:

first mixer means included in the feedback control loop, said first mixer means having inputs and an output;

fine tuning frequency synthesizer means being adjustable by an operator to provide a fine tuning control signal having any one of a plurality of predetermined frequencies;

first means coupling the noise components of the reference frequency oscillator to said fine tuning frequency synthesizer means, said fine tuning frequency synthesizer means being responsive to the noise components to provide a noise control signal;

second means coupled between said fine tuning frequency synthesizer means and one of said inputs of said first mixer means, said second means coupling the noise control signal and the fine tuning control signal to said first mixer means;

said first mixer means being responsive to said noise control signal to reduce the magnitude of at least some of the noise components from the output signal at the output of said first mixer means to reduce the effect of the noise components on the output signal of the phase locked loop; and said first mixer means being responsive to a change in the frequency of said operator selectable fine tuning control signal to change the output frequency of the output signal of the phase locked loop in response to operator adjustment of the frequency of said fine tuning control signal.

6. The phase locked loop circuit of claim 5 wherein said second means includes second mixer means.

7. In a dual conversion signal processing system having a first mixer for providing a first selected frequency band, a second mixer coupled to receive the first selected frequency band from the first mixer, a first local oscillator including a phase locked loop coupled to the first mixer, the phase locked loop having a third mixer, and a second local oscillator coupled to the second mixer, further including a frequency control means for adjusting the center frequency of the first selected frequency band, the frequency control means having:

a fourth mixer having a first input, a second input coupled to the output of the second local oscillator, and an output coupled to the third mixer;

frequency synthesizer means providing an output signal having a frequency adjustable within a predetermined frequency range, said frequency synthesizer means being coupled to said first input of said fourth mixer; and said frequency control means tuning the frequency of the phase locked loop to adjust the center frequency of the first selected frequency band.

8. The dual conversion signal processing system of claim 7 wherein the phase locked loop further includes a reference frequency oscillator which tends to create noise components which tend to undesirable effect the output of the phase locked loop and wherein the third mixer has a first input terminal, a second input terminal and an output terminal, further including:

first means coupling the noise components of the output signal of the reference frequency oscillator to said frequency control means, said frequency control means being responsive to the noise components to provide a noise control signal to said first input terminal of the third mixer;

second means coupling the noise components to the second input terminal of the third mixer; and the third mixer being responsive to said noise control signal and the noise components to reduce the magnitude of at least some of the noise components from the output signal at the output terminal of the third mixer to reduce their effect on the output of the phase locked loop.

9. The dual conversion signal processing system of claim 7 wherein said frequency control means includes a further phase locked loop.

10. The dual conversion signal processing system of claim 7 wherein said frequency control means includes:
adjustable reference frequency oscillator means providing an output signal at an output terminal thereof having a frequency which is adjustable over a predetermined frequency range;
detector means having a first input terminal, a second input terminal and an output terminal, said first input terminal of said detector means being coupled to said output terminal of said adjustable reference frequency oscillator means;
voltage controlled oscillator means having a control terminal and an output terminal, said control terminal of voltage controlled oscillator means being coupled to said output terminal of said detector means, said output terminal of said voltage controlled oscillator means being coupled to said fourth mixer;
fifth mixer means having a first input terminal, a second input terminal and an output terminal, said first input terminal of said fifth mixer means being coupled to said output terminal of said voltage controlled oscillator means, said second input terminal of said fifth mixer means being coupled to the output of the second local oscillator, said output terminal of said fifth mixer being coupled to said second input terminal of said detector means; and
said frequency control means thereby being adapted to provide fine tuning frequency control signals to said fourth mixer.

11. The dual conversion signal processing system of claim 10 wherein
the phase locked loop of the first local oscillator includes an oscillator providing an output signal having a reference frequency; and
the magnitude of said predetermined frequency range of said adjustable reference frequency oscillator means is equal to at least twice the magnitude of the reference frequency.

12. The dual conversion signal processing system of claim 7 wherein the third mixer facilitates cancellation of noise created by the second local oscillator.

13. The dual conversion signal processing system of claim 12 wherein said frequency control means provides a noise suppression control signal to said third mixer which facilitates cancellation of noise generated by the second local oscillator.

* * * * *